United States Patent
Hofmeister et al.

[15] 3,679,829
[45] July 25, 1972

[54] ELECTRONIC CHASSIS ASSEMBLY FOR A TELEVISION RECEIVER

[72] Inventors: Richard J. Hofmeister, 802 E. Crabtree Drive, Arlington Heights, Ill. 60004; Edward A. Salners, 700 Elderberry Lane, Mount Prospect, Ill. 60056

[22] Filed: Nov. 27, 1970

[21] Appl. No.: 92,997

[52] U.S. Cl...........................178/7.9, 178/7.8, 317/101 CB, 317/101 OH, 317/101 CC, 325/357
[51] Int. Cl.........................................H04n 5/64, H02b 9/00
[58] Field of Search........178/7.8, 7.9; 317/101 CB, 101 OH, 317/101 CC, 101 R; 325/357

[56] References Cited

UNITED STATES PATENTS

| | | | |
|---|---|---|---|
| 2,898,585 | 8/1959 | Bauman | 317/101 |
| 2,994,807 | 8/1961 | Devine | 317/101 CB |
| 3,012,172 | 12/1961 | Kammer | 317/101 CB |
| 3,488,628 | 1/1970 | Lundergan | 317/101 OH |
| 2,560,320 | 7/1951 | Winkler | 325/357 |

*Primary Examiner*—Robert L. Griffin
*Assistant Examiner*—Joseph A. Orsino, Jr.
*Attorney*—Vincent Rauner and L. Arnold

[57] ABSTRACT

A television receiver including a cabinet housing with a front viewing face having an electronic chassis assembly movably mounted therein on which to mount instrumentalities including electronic modules in the form of printed circuit boards. The chassis assembly includes a plurality of enclosing wall portions defining an accessible internal cavity, one wall portion being pivotally mounted to provide additional access to the cavity, and a plurality of interconnected internal plates providing mounting surfaces and electrical shielding for the instrumentalities Grounding terminal means are separately mounted or integrally formed on the mounting surfaces for connecting and grounding the electronic modules to the chassis assembly. High radiation type electronic modules include a frame assembly of metal stampings having a plurality of grounding points for electrical hot spots and providing shielding between selected portions of the modules.

8 Claims, 5 Drawing Figures

INVENTORS
RICHARD J. HOFMEISTER
EDWARD A. SALNERS
BY Lester N Arnold
ATTY.

INVENTORS
RICHARD J. HOFMEISTER
EDWARD A. SALNERS
BY Lester N. Arnold
ATTY.

ELECTRONIC CHASSIS ASSEMBLY FOR A TELEVISION RECEIVER

BACKGROUND

This invention relates to television receivers having drawer type electronic chassis assemblies which can be removed and serviced from the front viewing face of a cabinet housing. More particularly, the invention relates to an electronic chassis assembly which has increased mounting surfaces for instrumentalities of the receiver, greater access thereto, and more selective shielding between radiation type components and circuitry.

Through the use of solid state electronics, printed and integrated circuit art, and similar modern technical advances, television manufacturers have been able to greatly reduce the constructional complexity of the standard color television receiver chassis and to increase the number of instrumentalities that are mountable thereon until only the picture tube and a few relatively bulky parts remain separately mounted. This simplification of construction reduces the cost of initial manufacture, improves the service and repair of the receiver, and enhances the acceptability of the receiver to the consumer by meeting consumer demands for reducing the cost of maintenance and for providing an electronic chassis lending itself to home repair.

One such electronic chassis assembly is of the drawer type wherein it removes from the front viewing face of the cabinet housing yielding ready access to its internally mounted instrumentalities. Although this type chassis assembly has met with much commercial acceptance due to the accessibility and ease of maintenance of the instrumentalities not heretofore achieved, some of its features which lend themselves for improvement are the size and weight of the enclosure walls and the internal structural support members; the access to the internal portions of the instrumentalities through the available openings; the grounding and shielding for the electronic modules; and the quantity of mounting surfaces on which to mount the instrumentalities including electronic modules in the form of printed circuit boards having electronic components thereon.

SUMMARY

It is therefore an object of the present invention to provide a drawer type electronic chassis assembly having greater access to the internal portions of the mounted instrumentalities without the need for removing the same from the chassis assembly.

It is another object of the invention to provide structural bracing and rigidity integrity for the electronic chassis assembly while simplifying the construction of enclosing wall portions and internal plates.

It is still another object to provide an increase in the available areas serving as mounting surfaces for the instrumentalities of the receiver.

It is yet another object of the invention to provide more selective electrical shielding between radiation type electronic modules and better grounding means for printed circuit boards.

An electronic chassis assembly is movably mounted within the front viewing face of a cabinet housing for a television receiver and has an outer metal frame structure of enclosing wall portions defining an internal cavity and two opposite side openings thereto. One of the wall portions comprises a pivotable door movable to an open position for providing further access to the internal cavity. Interconnected metal plates within the cavity impart rigidity to the frame structure and provide mounting surfaces for and electrical shielding between internally mountable instrumentalities for the receiver. Electronic modules in the form of printed circuit boards having electronic components mounted thereon are removably connected to the mounting surfaces through grounding terminal means which insure more adequate grounding and provide ready attachment and detachment of the modules. High radiation type electronic modules include a frame assembly of metal stampings having a plurality of grounding points and providing shielding between selected portions of the modules.

THE DRAWING

DETAILED DESCRIPTION

Figure 1:
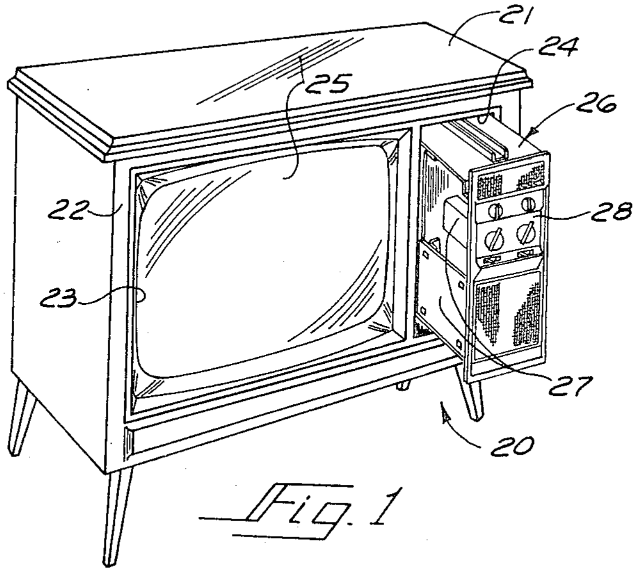
FIG. 1 is a front perspective view of a television receiver cabinet showing an electronic chassis assembly in an external forward position.
Figure 2:
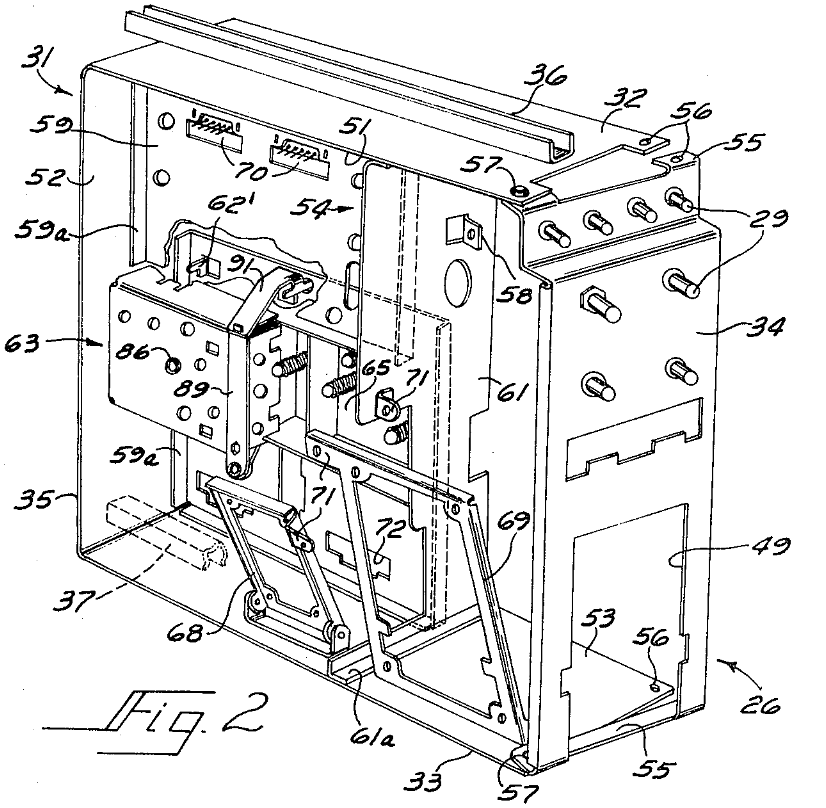
FIG. 2 is a front perspective view of the electronic chassis assembly of FIG. 1 without any instrumentalities mounted thereon except for an intermediate frequency panel section.

Referring to FIGS. 1 and 2, there is shown a television receiver 20 incorporating the features of the present invention wherein a cabinet housing 21 has a front viewing face 22 including first and second cabinet openings 23 and 24 therein. A picture tube 25 is positioned within the cabinet 21 so as to be visible through the first cabinet opening 23 in a well known manner. In the second opening 24 there is positioned a main or primary electronic chassis assembly 26 which is shown as being partially withdrawn from the second opening 24 in FIG. 1.

The television receiver 20 includes within its cabinet housing 21 a variety of instrumentalities, some of which are shown at 27 mounted on the chassis assembly 26, that are necessary to enable the picture tube 25 to successfully receive and display transmitted audio and video informational signals. It is well known that the complexity of color television receivers is greater than that of black and white receivers, and although the novel features of the electronic chassis assembly 26 are equally as well applicable to both type receivers, the features are especially advantageous to color receivers because of the greater complexity and numbers of instrumentalities required to be mounted on the chassis assembly 26. Therefore, for the purpose of illustrating the invention, the receiver 20 is represented as a color television receiver.

Figure 5:
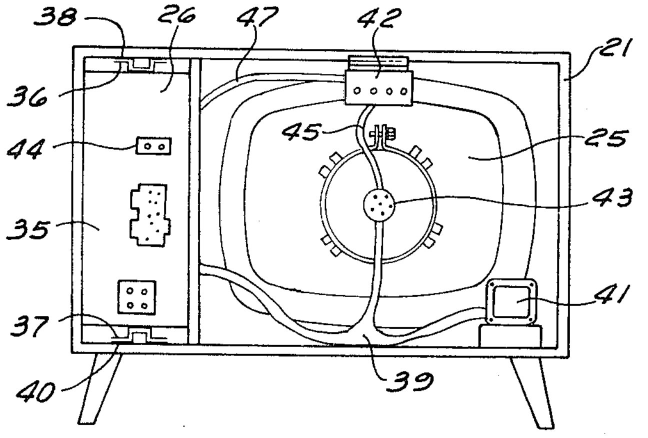
FIG. 5 is a rear view of the television receiver cabinet of FIG. 1 showing the chassis assembly in an internal rearward position.

The electronic chassis assembly 26 serves as a housing on which to mount substantially all of the instrumentalities of the receiver 20 except for the picture tube 25 and a few relatively bulky parts such as wiring harnesses 39, 45 and 47 plus a power supply chassis and transformer 41 of FIG. 5. During normal operation of the television receiver the chassis assembly 26 is positioned entirely internal to the cabinet 20 in a first operable position. As shown in FIGS. 1 and 2, the chassis assembly includes a front control panel 28 which presents various control dials and selector knobs connectable to rotary keys 29, which dials and knobs may be adjusted to manipulate and control the instrumentalities 27 for proper reception of television programs. In the first operable position of the chassis assembly 26 the control panel 28 is substantially flush with the front viewing face 22 of the cabinet 21 to give a completed aesthetic appearance thereto.

The electronic chassis assembly 26, as best shown in FIG. 2, has an outer frame structure 31 having a plurality of enclosing wall portions including top and bottom enclosure or side walls 32 and 33 and front and rear enclosure or side walls 34 and 35, respectively. The chassis assembly 26 has an upper track-like slide 36 mounted on the top enclosure wall 32 and a similar lower track-like slide, a portion of which is shown at 37, on the bottom enclosure wall 33. The slides 36 and 37 are engageable with complementary guiding tracks or slides 38 and 40, FIG. 5, positioned within the cabinet 21 to slidably mount the electronic chassis assembly within the second cabinet opening 24.

Through the use of this movable mounting arrangement, the chassis assembly 26 is capable of being withdrawn through the second cabinet opening to a second operable position wherein chassis 26 is substantially external to the cabinet 21. With the chassis in the second operable position the instrumentalities 27 of the receiver 20 are accessible for service and repair from the front face 22 of the television receiver. The chassis can be released from suitable catch means provided within the cabinet or on the chassis assembly in order to entirely remove the chassis for maintenance or replacement.

FIG. 5 shows a rear view of the cabinet housing 21 with a rear enclosure panel removed wherein the power supply chassis and transformer 41, a video drive unit 42, the main electronic chassis assembly 26 and yoke assembly 43 on the rear of picture tube 25 are interconnected by the wiring harnesses 39, 45 and 47. The wiring harnesses distribute power throughout the receiver 20 as required. The chassis assembly 26 has a first half of a connector means 44 on its rear wall 35, FIG. 5, which mates with a second half of the connector means (not shown) on removed rear enclosure panel to supply external power to the chassis assembly 26 and the wiring harnesses with the chassis in its first operable position. A cheater cord can be used in a well known manner as by a qualified serviceman to connect to the first connector half 44 to thereby supply power to the chassis assembly 26 with the chassis in its second operable position.

Among the instrumentalities 27 that are to be mounted on the chassis assembly 26, there are included individual component parts and electronic modules in the form of printed circuit boards with electronic components and interconnecting electronic circuitry mounted thereon. Desirably, these component parts and electronic modules are to be easily mountable to and detachable from simple plug-in type connections with the chassis assembly 26, and require both accessibility for maintenance and adequate spacing for installation and removal. As was stated above the complexity of color television receivers requires additional instrumentalities; therefore, the additional numbers of component parts and electronic modules detracts from the accessibility and roominess of the chassis layout. Also, the bulk and weight of the fully mounted chassis 26 has heretofore required a plurality of bracings and strut members which have decreased the accessibility of the instrumentalities.

Now in accordance with the novel features of the main electronic chassis assembly 26, the outer frame structure 31 is made substantially strong and rigid without the need for any longitudinal or traverse bracings and strut members (other than in the form to be described hereinafter) partially through providing integrally formed top, bottom and rear side walls 32, 33 and 35 from an elongated relatively flat metal plate. By this means, the plate used for forming the walls 32, 33 and 35 can be made relatively thick and can be chosen to have a particular rigidity. The structural integrity of the outer frame structure 31 is further enhanced by a preselected matrix of interconnected internal plates 54 as will be set forth in detail hereinafter.

The outer frame structure 31 is then completed by the front wall 34 which cooperates with the top, bottom and rear walls 32, 33 and 35 to define an internal cavity 51 having two opposite side openings 52 and 53 providing access thereto. The front wall 34 is pivotally mounted along one of its longitudinal edge portions to adjacent portions of the top and bottom walls 32 and 33, and is preferably constructed of an elongated relatively flat metal plate for obtaining structural rigidity. Also, the front wall 34 has several cutaway portions or apertures therein in which to accommodate the mountings of certain instrumentalities for the receiver 20. For example, the larger aperture 49, FIG. 2, is intended to accommodate the speaker means for an audio receiving and reproducing system for the television receiver.

The particular manner in which the front wall 34 is shown pivotally mounted to the top and bottom walls 32 and 33 to thus form part of the outer frame structure 31 represents a design choice and it is apparent that other pivotal connections could be utilized. FIG. 2 shows the front wall 34 as having an elongated configuration with longitudinal and traverse edge portions with the traverse edge portions comprising top and bottom edge portions in the normal orientation of the chassis assembly 26 that is shown in the drawing. The top and bottom edge portions of the front wall 34 have inwardly turned flange portions 55 which overextend or overlie adjacent traverse edge portions of the walls 32 and 33. The flange portions 55 and the adjacent edge portions of the walls 32 and 33 are provided with suitable apertures 55 which can be aligned to optionally receive rivet connector means 57 or other securing connector means (not shown) for mounting the front wall 34.

The rivets 57 provide a relatively loose pivotal connection for the front wall 34 to thus comprise a pivotable door movable between open and closed positions by the removal of the securing connector means. Optionally, an additional internal aperture 58 can be provided by which to further mount the front wall 34 by the securing connector means. In its open position, the front wall 34 provides additional access to the internal cavity 51.

The interconnected matrix of internal plates 54 is comprised of mounting panels 59 and a strut panel or member 61 in the form of relatively flat metal plates and arranged in longitudinal and traverse patterns within the internal cavity 51 to form a plurality of sectional compartments within which to mount the instrumentalities 27 of the television receiver. This particular arrangement allows the internal plates to be used for structural support to brace and impart rigidity to the outer frame structure 31 in lieu of having a plurality of individual bracings and strut members in the form of inwardly in extending rim or flange portions or beam-like struts positioned, among other ways, along the longitudinal edge portions of the elongated top, bottom and side walls 32, 33 and 35. As shown in FIG. 2, the accessibility to the internal cavity 51 through the side openings 52 and 53 is then maximized.

The mounting panels 59 and the strut panel 61 are selectively connected together and connected to the outer frame structure 31 through integrally formed rim or flange portions 59*a* and 61*a*, respectively, that are provided along the edge portions Thereof. This manner of connection provides adequate surface areas of the panels 59 and 61 by which to attach the same to the frame structure without the necessity of providing extra bracings or beam-like struts along the longitudinal or traverse edge portions of the panels. The panels 59 and 61 are preferably welded together to provide the desired structural integrity but can obviously be interconnected in any suitable manner.

The relatively flat configurations of the outer walls 32–35 and the panels 59 and 61 provide a maximum amount of internal and substantially flat mounting surfaces at least along the internal sides of the outer walls and on opposite sides or surfaces of the panels, respectively. As stated above, the lack of separate internal bracings and strut members then allows the maximum use of these mounting surfaces. Another feature of the chassis assembly 26 is that the panels 59 and 61 provide electrical shielding between the instrumentalities and electronic modules positioned in the different compartments formed by the panels.

The particular compartmental configuration of the panels shown in FIG. 2 is intended to illustrate a preferred configuration for the panels, it being readily apparent that a number of different compartmental arrangements could be provided. FIG. 2 shows only one strut panel 61 and a pair of mounting panels 59. The strut panel 61 divides the internal cavity 51 into forward and rear cavity sections and the mounting panels 61 are oriented longitudinally of the outer walls 32 and 33 and within the rear cavity section so as to divide the rear cavity section into two opposite compartments accessible from the two opposite side openings 52 and 53, respectively. A slight modification (not shown) to this interconnection arrangement is that a plurality of more elongated strip-like mounting panels could be provided in the rear cavity section arranged in stacked relationship and having their opposite surfaces accessible from both side openings 52 and 53.

The front cavity section of the internal cavity 51 is accessible from the two side openings 52 and 53 as well as from the front of the chassis assembly 26 with the front wall 34 pivoted to its open position. This three-sided accessibility makes the front cavity section especially useful for housing the instrumentalities 27 of the receiver 20 other than the electronic modules as these type instrumentalities are not as readily attachable and detachable from their mountings as are the electronic modules. Also, these type instrumentalities include the front-mountable tuner adjustment means for the receiver 20 that require their internal portions to be accessible for certain adjustments. These tuner adjustment means can thus be more advantageously positioned in this front cavity section and can be optionally mounted on the interior side of the front wall 34 or on the front side of the strut panel 61.

The mounting panels 59 in the rear cavity section are optionally offset in their longitudinal division of the cavity section so as to provide relatively shallow and relatively deep portions within the two side accessible compartments for providing flexibility in the height of the electronic modules mountable therein. The mounting panels are more adaptable for the mounting of the electronic modules and have first conductive connectors 62 comprising grounding terminal means for mounting and grounding the electronic modules to the conductive mounting surfaces with a plug-in type connection.

Figures 3, 4:
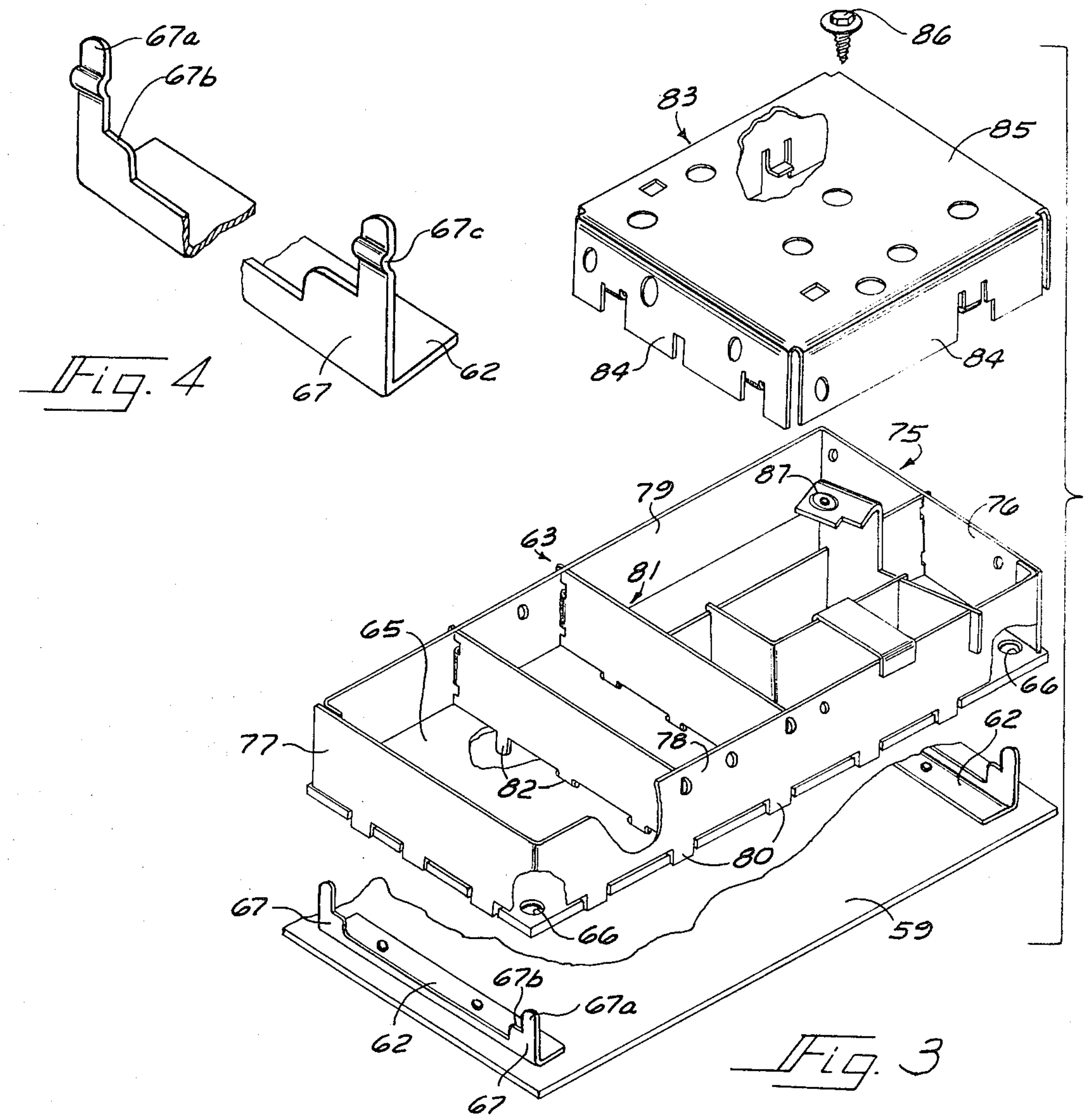
FIG. 3 is an exploded perspective view of the intermediate frequency panel section of FIG. 2.
FIG. 4 is a broken perspective view of an alternative embodiment of a grounding terminal means of FIG. 3.

FIGS. 2–4 show an electric module 63 in the form of a printed circuit board 65 having electronic components and interconnecting circuitry mounted thereon, which board contains suitable apertures 66, only two of which are shown in FIG. 3, desirably located approximately in the four corners of the board 65 for removably attaching the electronic module 63 to the connectors 62. The connectors 62 can be optionally provided as an integral part of the mounting panel, as indicated at 62' in FIG. 2, or provided as a separately attachable connector 62 as shown in FIGS. 3 and 4. The connectors 62 include a pair of raised attachment portions 67 (the connector 62' including only one such raised attachment portion), each portion having a protruding tab or finger **67*a* and a shoulder portion 67*b*** directly adjacent thereto.

In the manner of connecting the electronic module 63 to the connectors 62, each of the apertures 66 are aligned to receive a tab **67*a* of one of the raised portions 67, and the module mounted thereto by a simple push-on type movement. The underside or bottom side of the board 65 contains in a well known manner the interconnecting circuitry for the electronic module, and includes grounding nodes or terminals immediately adjacent one or more of the apertures 66. With the tabs 67 fully received within the apertures 66 so as to secure the module board 65 to the selected ones of the aligned connectors 62 or 62', the shoulder portions 67*b* support the board 65 and conductively engage the grounding nodes thereof to provide one or more grounding connections from the board 65 to the respective mounting surface. FIG. 4 shows an alternative embodiment of the connector 62 wherein similar parts are designated by the same reference numerals, the only variation in structure being an arcuate portion 67*c* provided intermediately of each of the tabs 67*a* for forcing or biasing the board 65 into engagement with the shoulder portions 67*b* when passed through the apertures 66**.

It is apparent that if the connectors 62 are utilized that only two such connectors are required to mount a single printed circuit board, but four of the connectors 62' are so required. In either case, the number of such connectors required comprises a set of connectors or grounding terminal means wherein a plurality of such sets are required in order to mount a corresponding plurality of electronic modules. For those electronic modules in which it is not desired to utilize the conductive connectors 62 or 62', a plastic standoff as commonly known in the art (not shown) can be substituted therefor and the desired grounding connection realized with a conductive strip connected from the board 65 to the conductive mounting panels 59. The mounting panels 59 are provided with interpanel connectors 70 which are insertably received in suitably shaped apertures 72 in a plug-in fashion, and which include pin-type connections thereon for mating with complementary plug-in type connectors (not shown) for the electronic modules so that the modules may be entirely removed from the mounting panels 59 without the need for severing any wiring connections thereto.

Also, additional accessibility is provided to the instrumentalities including electronic modules through the use of pivotally connected frameworks, such as indicated at 68 and 69 in FIG. 2, which are mounted in the cavity sections and pivot to an open position to allow greater access to those instrumentalities that may be mounted thereon. For illustrative purposes, the frameworks 68 and 69 might be utilized to mount a pincushion panel and a convergence panel for the receiver 20, respectively. The frameworks 68 and 69 may be secured in a closed position with a single screw as indicated by the brackets 71 of FIG. 2.

Some electronic modules for the receiver 20 include high radiation type electronic components and interconnecting circuitry thereon which have critical grounding considerations such as the intermediate frequency panel section. These modules require special grounding and shielding considerations for which the present electronic chassis assembly 26 with its grounding terminal means 62 or 62' and sectional compartments offer novel features. For the purpose of illustrating this portion of the invention, it is convenient to represent the electronic module 63 as the intermediate frequency panel section for the television receiver.

FIG. 3 shows the printed circuit board 65 without the electronic components and interconnecting circuitry so that other features thereof can be better illustrated; however, such high radiation type components and circuitry should be understood to be present as is shown in FIG. 2. The board 65 includes an outer conductive frame assembly 75 comprised of a plurality of simple elongated metal stampings or plates suitably connected to form enclosing wall portions, namely, a pair of opposite end walls 76 and 77 and a pair of opposite side walls 78 and 79.

The enclosing wall portions of the frame assembly 75 are conveniently positioned upon a longitudinal edge portion thereof substantially around the periphery of the board 65 to form an internal cavity across one surface of the board and are attached thereto through a plurality of first protruding tabs 80 comprising first connector means. Desirably, the tabs 80 are accommodated within recessed portions of the peripheral edges of the board 65 so as to present a flush mounting thereto. The tabs 80 can be soldered or secured to the board 65 in any convenient manner which will provide a potential grounding node or connection at any one or more of these peripheral attachment points. Also, the end walls 76 and 77 and the side walls 78 and 79 impart rigidity to the board 65, thus tending to prevent the board from warping under the stresses of its environmental application.

Across the one surface of the printed circuit board 65, a plurality of internal conductive plates in the form of the same simple elongated metal stampings are selectively interconnected and connected to the frame assembly 75 to comprise a second preselected matrix of interconnected internal plates 81 similar to the matrix of interconnected plates 54 for the chassis assembly 26. This second matrix of interconnected plates 81 enhances the structural integrity of the frame assembly 75 and the board 65 through imparting rigidity thereto and substantially aids in preventing board warpage.

The interconnected plates 81 define a plurality of sectional compartments which can be arranged to have various compartmental configurations, each individual compartment electrical shielding from adjacent compartments and selective mounting compartments for the high radiation and critical grounding components and circuitry. Also, each individual internal plate of the interconnected plates 81 is connected or attached to the board 65 by providing a plurality of second protruding tabs 82 comprising second connector means along a longitudinal edge thereof that are insertedly received within suitable apertures through the thickness of the board 65. These internal connections are preferably soldered or secured to the board 65 in any convenient manner which will provide a potential grounding node or connection at any one of more of these internal attachment points. In this manner, electrical shielding is provided between selectable portions of the board 65 and a plurality of peripheral and internal grounding nodes are provided for grounding electrical hot spots. Portions of the board 65 and the walls 77 and 78 have been removed in FIG. 3 in order to better illustrate the connections of the board 65 to the connectors 62 and the interconnecting internal plates 81 to the board 65.

To further enhance the grounding and shielding capabilities of the frame assembly 75 and the interconnecting internal plates 81, a cover portion 83 is provided having four enclosing side walls 84 and a top wall 85 for at least partially enclosing certain critical internal compartments of the board 65. Optionally, the cover portion 83 can be large enough to cover the entire board 65 by having its four side walls 84 engage the outer walls 76–79, or be less extensive so as to cover only a critical radiation or grounding portion of the board 65.

The cover portion 83 can be useful in providing improved grounding for the electronic module 63 by attaching the cover portion to the frame assembly 75 and the matrix of plates 81 so as to assure good electrical conductivity therebetween. This purpose can be adequately provided by the screw 86 being tightly received in a suitably provided aperture 87. To further enhance the grounding of the electronic module 63, a grounding strap 89 may be provided across the top wall 85 of the cover portion 83 to bias the board 65 onto the connectors 62. Additionally, a pair of side terminal straps 91 across which the grounding strap 89 is connected may include on their base portions the protruding tabs 67*a* and the shoulder portions 67*b* by which to support and conductively engage the board 65 of the electronic module 63.

It is to be understood that while the present invention has been shown and described with reference to the preferred embodiments thereof, the invention is not limited to the precise forms set forth, and that various modifications and changes may be made therein without departing from the spirit and scope thereof.

We claim:

1. In a television receiver, a cabinet having a front viewing face defining first and second openings therein, a picture tube mounted within said first opening for viewing a projected image therethrough, a plurality of instrumentalities including electronic modules in the form of printed circuit boards with electronic components mounted thereon for said receiver, an electronic chassis assembly movably mounted in said second opening and movable between first and second operable positions wherein said chassis assembly is internal to said cabinet in said first position and is substantially external to said cabinet in said second position, said electronic chassis assembly including in combination:

- an outer conductive frame structure having four enclosing wall portions defining therebetween an internal cavity and two opposite side openings providing access to said internal cavity,
- said enclosing wall portions having internal surfaces of which portions thereof are substantially flat to provide mounting surfaces for said instrumentalities,
- three of said enclosing wall portions being integrally connected and the remaining one of said enclosing wall portions being pivotally mounted to adjacent wall portions for providing access to instrumentalities mounted thereon and to said internal cavity,
- said chassis assembly being mounted with the remaining one of said enclosing wall portions positioned parallel and contiguous with the front viewing face and having at least some of the manual controls operatively attached thereto,
- a plurality of internal, conductive plates having opposite surfaces of which portions thereof are substantially flat to provide additional mounting surfaces for said instrumentalities,
- said internal plates being selectively connected together and connected to adjacent ones of said enclosing wall portions to impart rigidity to said frame structure and arranged in a preselected matrix within said internal cavity to provide electrical shielding between said instrumentalities mounted on said opposite surfaces, and
- means for mounting and grounding said electronic modules to said mounting surfaces.

2. An electronic chassis assembly as claimed in claim 1 wherein said enclosing wall portions comprise top, bottom, front and rear side walls, said top, rear and bottom side walls are integrally formed from an elongated relatively flat metal plate, said front wall is an elongated relatively flat metal plate and is pivotally mounted along a longitudinal edge portion thereof to adjacent edge portions of said top and bottom walls.

3. An electronic chassis assembly as claimed in claim 1 wherein said internal plates are arranged to define a plurality of sectional compartments within said internal cavity to comprise said preselected matrix, each compartment has mounting surfaces therein and provides electrical shielding from adjacent compartments, one of said compartments includes tuner type instrumentalities having adjustment means positioned internal to said one compartment and is partially defined by said one wall portion so as to provide access to the internal adjustment means of said tuner with said one wall portion pivoted to its open position.

4. An electronic chassis assembly as claimed in claim 3 wherein said one compartment is additionally accessible from said two opposite side openings, and each of the other compartments is accessible from at least one of said two opposite side openings.

5. An electronic chassis assembly as claimed in claim 1 wherein said means for mounting and grounding said electronic modules include a plurality of sets of first conductive connector means, said sets are selectively provided on said mounting surfaces and are adapted to receive said electronic modules, respectively, with a plug-in type connection, and each of said first connector means includes at least one finger portion for engaging said printed circuit board to mount said module to said mounting surface, and further includes at least one shoulder portion for supportingly and conductively engaging said board to provide a grounding connection from said board to said mounting surface.

6. An electronic chassis assembly as claimed in claim 5 wherein each set of said first conductive connector means additionally includes a means of biasing said printed circuit board into conductive engagement with said shoulder portions of said set of first connector means.

7. An electronic chassis assembly as claimed in claim 1 wherein at least one of said electrode modules includes high radiation and critical grounding electronic components thereon, an outer conductive frame assembly has a plurality of enclosing wall portions substantially surrounding the periphery of the printed circuit board for said one electronic module and are attached thereto through a plurality of first protruding tabs to comprise attachment points for selectively providing a grounding node at each of said attachment points and to impart rigidity to said board whereby said board is prevented from warping, a plurality of internal conductive plates are selectively connected together and connected to adjacent ones of said enclosing wall portions to define a plurality of sectional compartments providing electrical shielding from adjacent compartments, and said internal plates are attached to said board through a plurality of second protruding tabs to comprise attachment points for selectively providing a grounding node at each of said attachment points and to further impart rigidity to said board.

8. An electronic chassis assembly as claimed in claim 7 wherein at least some of said compartments containing said high radiation and critical grounding electronic components comprise critical compartments, and a cover portion is provided over said critical compartments substantially enclosing the same for providing electrical shielding therefor and is in conductive engagement with selected ones of said wall portions and said internal plates to provide continuity of grounding connection between said wall portions and said internal plates whereby electrical grounding and shielding for said critical compartments is greatly enhanced.

* * * * *